(12) United States Patent
Eastty et al.

(10) Patent No.: US 6,188,344 B1
(45) Date of Patent: Feb. 13, 2001

(54) SIGNAL PROCESSORS

(75) Inventors: Peter Charles Eastty, Oxford; Christopher Sleight, Chipping Norton; Peter Damien Thorpe, Oxford, all of (GB)

(73) Assignees: Sony Corporation, Tokyo (JP); Sony United Kingdom Limited, Weybridge (GB)

( * ) Notice: Under 35 U.S.C. 154(b), the term of this patent shall be extended for 0 days.

(21) Appl. No.: 08/979,687

(22) Filed: Nov. 26, 1997

(30) Foreign Application Priority Data

Nov. 27, 1996 (GB) .................................................. 9624672

(51) Int. Cl.⁷ .................................................. H03M 3/00
(52) U.S. Cl. .................................................. 341/143
(58) Field of Search .................... 341/143, 155, 341/141, 61, 152

(56) References Cited

U.S. PATENT DOCUMENTS

| 5,061,925 | 10/1991 | Sooch et al. . |
| 5,313,205 | 5/1994 | Wilson . |
| 5,625,358 | * 4/1997 | Wilson et al. ........................ 341/143 |
| 5,627,536 | * 5/1997 | Ramirez ............................... 341/141 |

FOREIGN PATENT DOCUMENTS

| 0 586 021 | 3/1994 | (EP) . |
| 0641085A1 | 3/1995 | (EP) . |
| 0642221A1 | 3/1995 | (EP) . |

\* cited by examiner

*Primary Examiner*—Brian Young
(74) *Attorney, Agent, or Firm*—Frommer Lawrence & Haug, LLP.

(57) ABSTRACT

A 1-bit signal processor receives a 1-bit signal having a first sampling rate eg 64 fs. An upconverter (41) increases the sampling rate to eg 128 fs. A series of Delta Sigma Modulators (42, 43) processes the signal. The processed signal is down-converted by a converter (44) to 64 fs. As least the Delta Sigma Modulators may be implemented on an integrated circuit. The down-converter is arranged to prevent noise being folded back into the signal band.

10 Claims, 4 Drawing Sheets

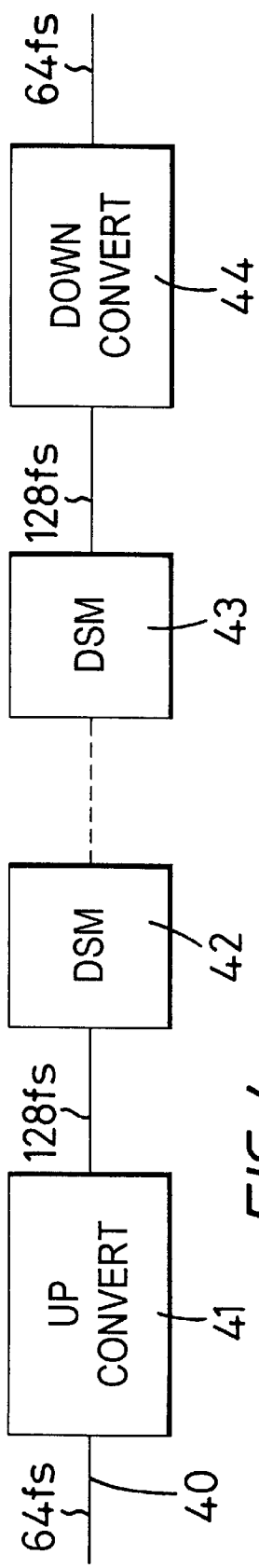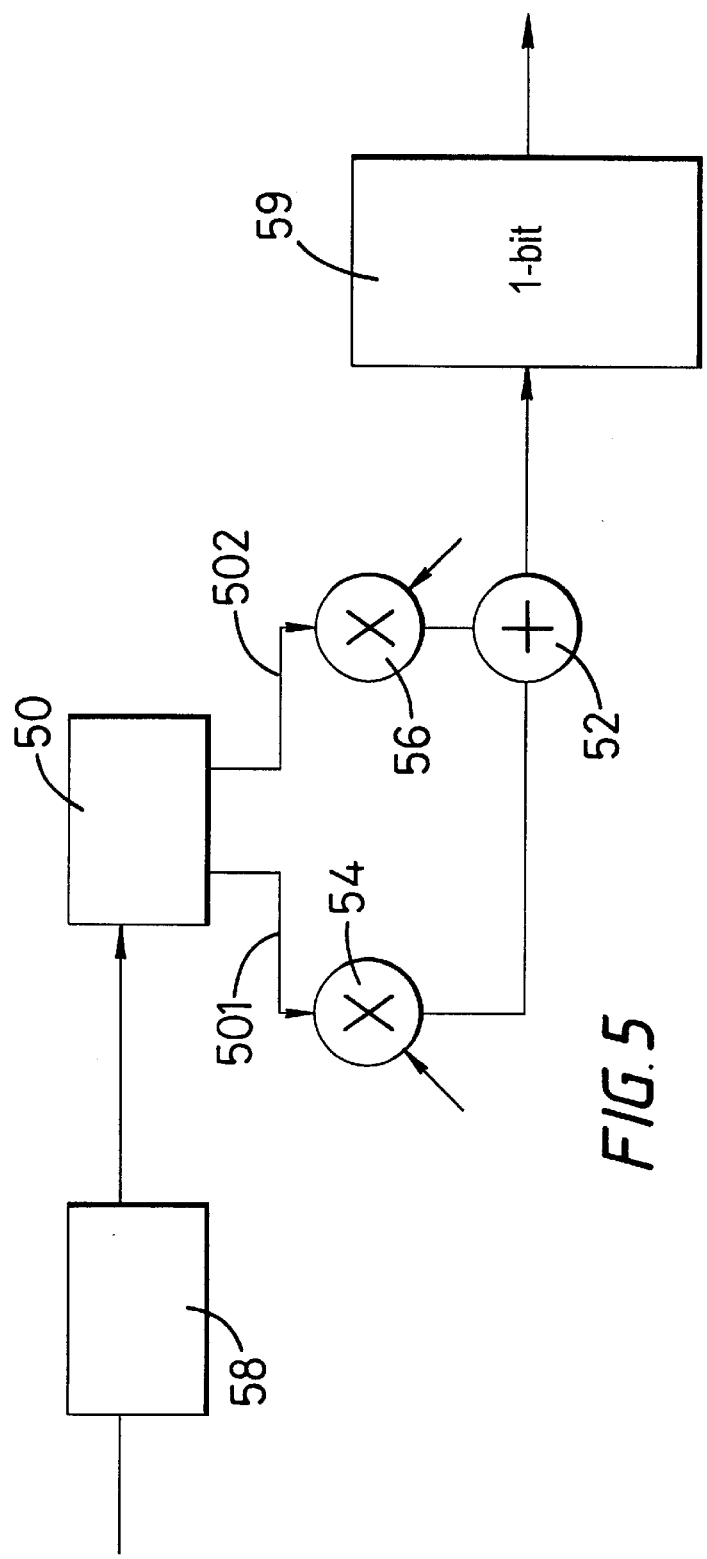

SIGNAL PROCESSORS

BACKGROUND OF THE INVENTION

1. Field of the Invention

The present invention relates to a 1-bit signal processor comprising nth order Delta-Sigma Modulators where n is at least one. Preferred embodiments of the invention relate to processing audio signals but the invention is not limited to audio signal processors.

2. Description of the Prior Art

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an nth order filter section and FIG. 3 shows a noise shaping characteristic.

It is known to convert an analogue signal to a digital form by sampling the analogue signal at at least the Nyquist rate and encoding the amplitudes of the samples by an m bit number. Thus if m=8, the sample is said to quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference (Delta) between an analogue input signal and the integral (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as nth order filter section for directly processing a 1-bit signal was proposed by N. M. Casey and James A. S. Angus in a paper presented at the 95th AES Convention Oct. 7–10, 1993 New York, USA entitled "One Bit Digital Processing of Audio Signals" (Signal Processing: Audio Research Group, The Electronics Department, The University of York, Heslington, York YO1 5DD England). FIG. 2 shows a 3rd order (n=3) version of such a DSM filter section.

Referring to FIG. 2, the DSM has an input 4 for a 1-bit signal and an output 5 at which a processed a 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1, a_2, a_3$ connected to the input 4, a second 1-bit multiplier $c_1, c_2, c_3$ connected to the output 5, an adder $6_1, 6_2, 6_3$ and an integrator $7_1, 7_2, 7_3$.

The 1-bit multipliers multiply the received 1-bit signal by p bit coefficients $A_1, A_2, A_3, C_1, C_2, C_3$ producing p bit multiplicands which are added by the adders $6_1, 6_2, 6_3$ and the sums passed to the integrators 7. In the intermediate stages the adders $6_2, 6_3$ also sum the output of the integrator of the preceding stage. A final stage comprises another 1-bit multiplier $A_4$ connected to the input which multiplies the input signal by a p bit coefficient $A_4$ and an adder $6_4$ which adds the multiplicand to the output of the integrator $7_3$ of the preceding stage. The sum is passed to the quantizer 2.

Within the DSM, two's complement arithmetic is used to represent the positive and negative p bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1, a_2, a_3, a_4$ to the output 5 and fed back by multipliers $c_1, c_2, c_3$ from the output 5. Thus coefficients A1 to A4 define zeros of the Z-transform transfer function of the audio signal and coefficients C1–C3 define poles of the transfer function of the audio signal.

The noise signal, however is fed-back from the quantizer by the multipliers $C_1–C_3$ so that coefficients C1–C3 define poles of the transfer function of the noise signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:
a) finding the Z-transform H(z) of the desired filter characteristic—e.g noise shaping function; and
b) transforming H(z) to coefficients.
This may be done by the methods described in
"Theory and Practical Implementation of a Fifth Order Sigma-Delta A/D Converter, Journal of Audio Engineering Society, Volume 39, no. 7/8, 1991 July/August by R. W Adams et al."
and in the above mentioned paper by Angus and Casey using the knowledge of the person skilled in the art. One way of choosing coefficients is outline in the attached Annex A.

SUMMARY OF THE INVENTION

According to the present invention, there is provided a signal processor for processing 1-bit signals comprising an input for receiving a 1-bit signal having a first sampling rate, means coupled to the input for increasing the sampling rate to a second rate greater than the first rate, a plurality of 1-bit nth order Delta-Sigma Modulators (where $n \geq 1$) in series for processing the signals at the second rate, and means coupled to the stages to receive the processed 1-bit signal and to reduce the sampling rate to the first rate for output from the processor.

By increasing the sampling rate, the quantization noise power is spread over a greater band width, reducing noise in the signal band.

In addition, in an embodiment of the invention the series of DSM's are implemented on a silicon integrated circuit. By increasing the sampling rate better use is made of the frequency response of the integrated circuit in addition to spreading the quantisation noise power.

The 1-bit signal comprises samples representing +1 and −1. The increasing means or up converter may increase the sampling rate by repeating sample values or by adding zeroes to the bit stream. For example to double the sample rate each +1 is repeated once to give +1,+1 and each −1 is repeated to give −1,−1. Alternatively zeroes are provided between successive samples. Repeating sample values maintains a good approximation to the desired frequency responses and maintains signal energy. Adding zeroes maintains the frequency response but dilutes the signal energy.

The reducing means or down converter may take various forms. It is important in embodiments of the invention that the down converter operates to prevent quantisation noise being folded back into the signal band.

In an embodiment of the invention, the down converter may be an FIR filter to prevent noise entering the signal band. Alternatively the down converter may comprise a DSM acting as down converter and filter.

In one version of a down converter for halving the sample rate, a DSM as described in co-filed UK application 9624671.5 (I-96-24, P/1509.GB) (co-filed U.S. Ser. No. 08/978,844 incorporated herein by reference) or UK patent application 9624673.1 (I-96-25, P/1510.GB) (co-filed U.S. Ser. No. 08/979,726 incorporated herein by reference) is used, the DSM having two signal inputs at which odd and even samples of the bit stream are received simultaneously.

Using DSMs has the advantage that 1-bit signals are input to the DSMs and also 1-bit signals are output from the DSMs.

Audio signals are usually sampled at a sampling rate fs of 44.1 or 48 kHz before digitization, with an accuracy of m bits where m>>1. 1-bit signals are sampled at for example 64 fs or about 3 MHz. In accordance with an embodiment of the invention the sampling rate is up-converted to 128 fs or higher e.g. 256 fs.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 4 is a block diagram of a signal processor according to the present invention;

FIG. 5 is a block diagram of a down converter in the form of a FIR filter;

DESCRIPTION OF THE PREFERRED EMBODIMENTS

Figure 1:
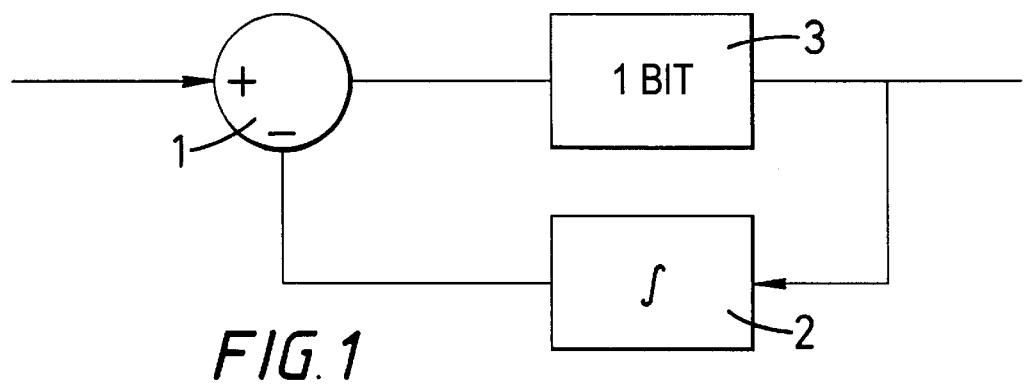
FIGS. 1–3 are block diagrams of the related art.
Figure 2:
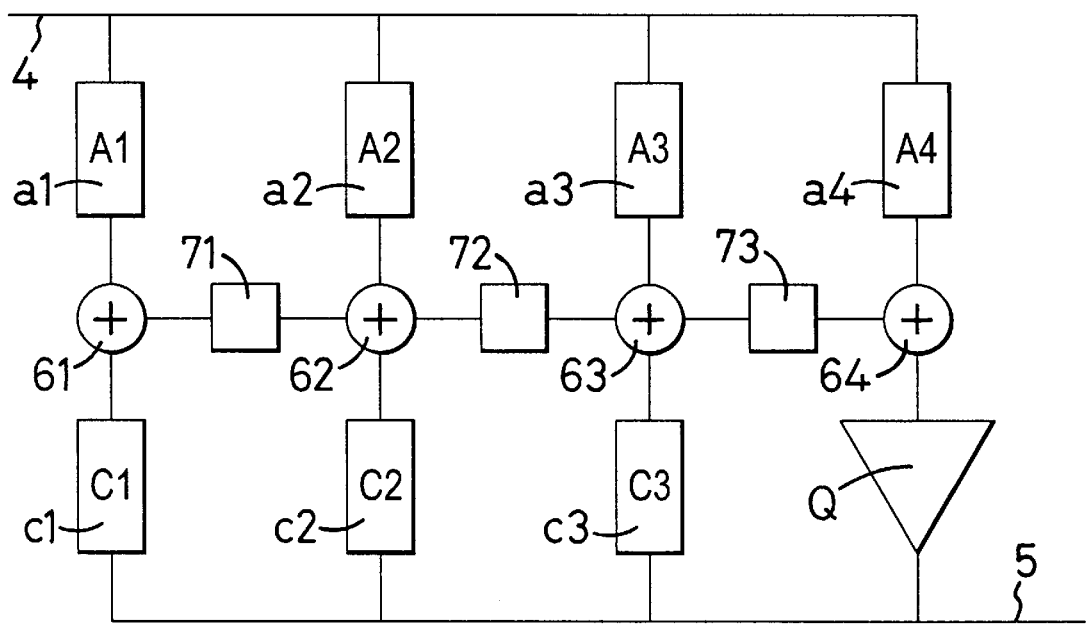
Figure 3:
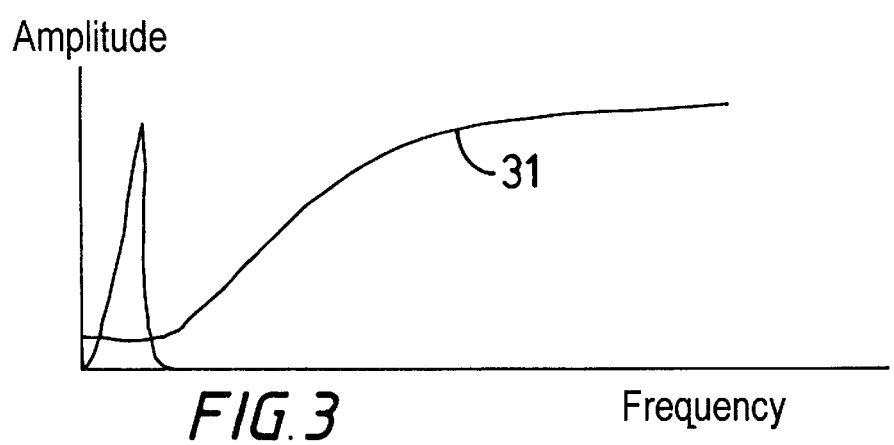

Referring to FIG. 4, a 1-bit signal at an input 40 has a sampling rate of for example 64 fs where fs is a standard audio signal sampling rate fs is for example 44.1 or 48 KHz.

An up converter 41 increases the sampling rate in this example to 128 fs. The up converter increases the sampling rate by repeating sample values or by inserting zeroes into the bit stream.

The up converted signal is processed by a series of Delta-Sigma Modulators (DSMs) 42, 43, only two being shown.

Up converting spreads the noise power over a larger bandwidth and improves signal to noise ratio in the signal band.

A down converter 44 reduces the sampling rate back to 64 fs.

In a preferred embodiment, at least the series of DSMs 43, 44 are implemented on a silicon integrated circuit. By up converting better use is made of the frequency characteristics of the integrated circuit.

The up converter and/or the down converter may also be implemented on the integrated circuit.

The down converter 44 operates to reduce the sampling rate to a desired value, e.g. 64 fs. It does that preferably without reducing the signal-to noise ratio in the signal band. It avoids folding out-of-band noise into the signal band.

FIG. 5 shows an example of a down converter in the form of a first order FIR filter. The 1-bit signal from e.g. DSM 43 is fed to scaling circuit 58 which scales the input signals by ½ to compensate for the subsequent summing of odd and even samples. The scaled input samples are then fed to a unit 50 which down converts the sampling rate by providing odd samples on output 501 and even samples on output 502 each odd sample being output simultaneously with its corresponding even sample at a sampling rate of 64 fs. The outputs of the unit 50 are coupled to an adder 52 via coefficient multipliers 54, 56. The output of the adder is a signal at 64 fs, adjacent odd and even samples of the input signal being combined.

A disadvantage of the FIR filter 50 to 58 is that it converts the 1-bit signal to p bit form (p>>1). A 1-bit converter 59 is thus provided at the output of the FIR filter to convert the p bit signal to 1-bit form.

Figure 6:
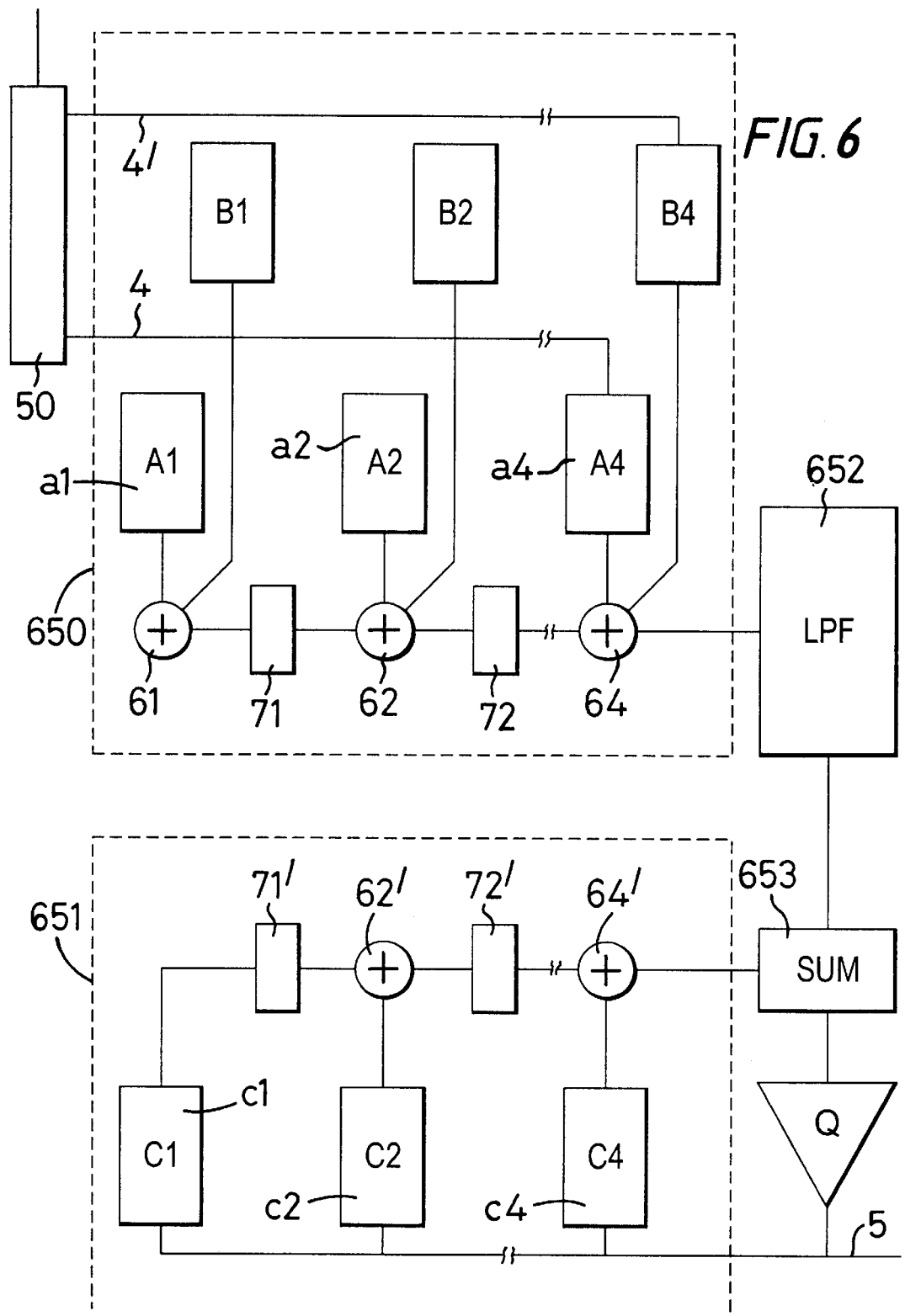
FIG. 6 is a block diagram of a down converter implemented as a DSM.

FIG. 6 illustrates a DSM configured as a down converter. The DSM of FIG. 6 is a modification of the DSM described in co-filed UK application 9624674.9 Attorney reference P/1508.GB (I-96-16) (co-filed U.S. Ser. No. 08/979,761 incorporated herein by reference), to which attention is directed. It is modified by the addition of a unit 50 similar to unit 50 of the filter of FIG. 5, which supplies even samples to input 4 and simultaneously odd samples to input 4' at a sampling rate of 64 fs and by the addition of coefficient multipliers B1–B4 connecting the second input 4' to adders 61–64 of a linear signal processing stage 650 of the DSM.

The linear signal processing stage 650 operating at 64 fs combines the odd and even samples of the bit stream. The output of section 650 is a p-bit signal where p>1. The output of the linear signal processing stage 650 is filtered by a low pass filter 652 and fed via an adder 653 to a quantizer Q. Quantizer Q quantizes the output of the adder 653 to one bit form to provide the output signal at output 5 of the DSM. The output signal is fed back to the summer 653 via a noise shaping section 651.

The low pass filter 652 is an FIR filter as shown at 50 to 58 of FIG. 5.

The coefficients A1–A4, B1–B4, C1–C4 and the low pass filter 652 are chosen to provide the desired filter characteristic. The coefficients A1–A4 and B1–B4 scale the samples so combined samples have unity magnitude.

The DSM has the advantage that both the input and output signals are in 1-bit form.

Figure 7:
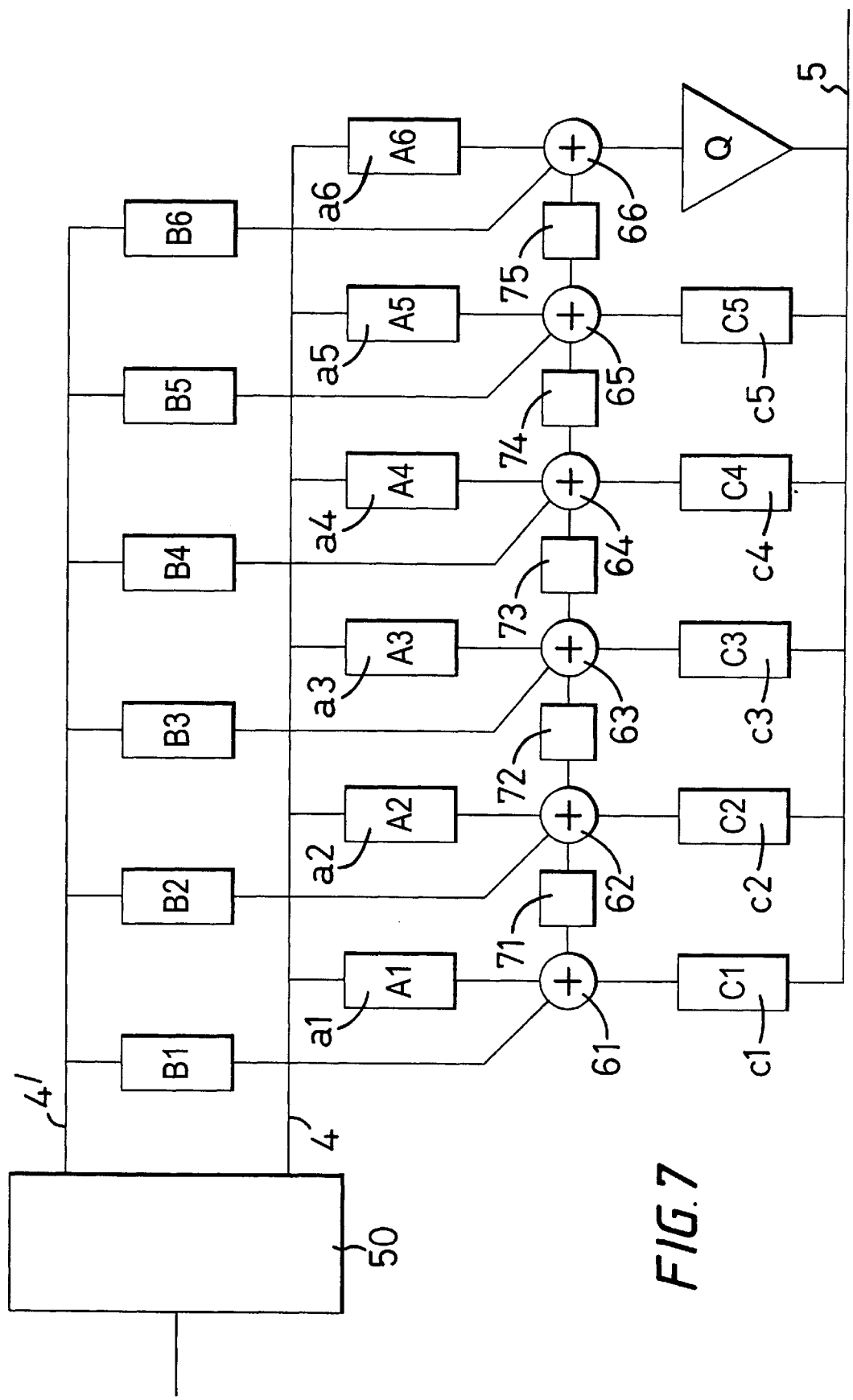
FIG. 7 is a block diagram of a down converter implemented as another DSM.

FIG. 7 shows another DSM configured as a down converter. The DSM of FIG. 7 is a modification of the DSM described FIG. 7 of co-filed UK application 9624673.1 Attorney Reference P/1510.GB (I-96-25) (co-filed U.S. Ser. No. 08/979,726 incorporated herein by reference) to which attention is directed. It is modified by the addition of a unit 50 a first output of which supplies odd samples to a first input 4 of the DSM and a second output of which supplies even samples simultaneous with the odd samples to a second input 4' of the DSM. The odd and even samples have a sampling rate of 64 fs. The DSM operating at 64 fs combines odd and even samples of the bit stream.

The coefficients A1–A6, B1–B6 and C1–C5 are chosen to provide the desire frequency characteristic. Coefficients A1 to A6 and B1 to B6 also scale the odd and even samples so combined samples have unity magnitude.

The DSM of FIG. 7 is an nth order (where n is greater than or equal to 3) DSM having a first input 4 for receiving odd signal samples and a second input 4' for receiving even signal samples.

A quantizer Q requantizes a p bit signal to 1-bit form the requantized signal being the output 5 signal of the DSM.

A plurality of signal combiners are provided. A first combiner 61, 71, a1, c1 forms an integral of an additive combination of the product of the odd samples and a first coefficient A1, of the product of the even samples and a second coefficient B1 and of the product of the output signal and a third coefficient C1. At least two intermediate combiners form an integral of an additive combination of the product of the odd samples and a first coefficient A2–A5 and of the product of the even samples and a second coefficient B2–B5 and of the product of the output signal and a third coefficient C2–C5 and of the integral of the preceding stage.

A final combiner 66, a6 forms an additive combination of the product of the odd samples and a first coefficient A6 and of the product of the even samples and a second coefficient B6 and of the integral of the preceding stage to form the said p bit signal which is requantized by the quantizer.

The DSM of FIG. 7 maybe regarded as a 3rd order modulator having a second order filter section, although it will be appreciated that physically the 2nd order filter section is not separate from the 3rd order modulation, the filter and modulator being distributed over the 5th order DSM shown.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

ANNEX 1

CALCULATING COEFFICIENTS

This annex outlines a procedure for analysing a fifth order DSM and for calculating coefficients of a desired filter characteristic.

A fifth order DSM is shown in Figure A having coefficients a to f and A to E, adders 6 and integrators 7. Integrators 7 each provide a unit delay. The outputs of the integrators are denoted from left to right s to w. The input to the DSM is a signal x[n] where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$y[n]=fx[n]+w[n]$ $w[n]=w[n-1]+ex[n-1]+Ey[n-1]+v[n-1]$ $v[n]=v[n-1]+dx[n-1]+Dy[n-1]+u[n-1]$ $u[n]=u[n-1]+cx[n-1]+Cy[n-1]+t[n-1]$ $t[n]=t[n-1]+bx[n-1]+By[n-1]+s[n-1]$

ANNEX 2

$s[n]=s[n-1]+ax[n-1]+Ay[n-1]$

These equations are transformed into z-transform equations as well known in the art resulting in equations set 2.

$Y(z)=fX(z)+W(z)$ $W(z)(1-z^{-1})=z^{-1}(eX(z)+EY(z)+V(z))$ $V(z)(1-z^{-1})=z^{-1}(dX(z)+DY(z)+U(z))$ $U(z)(1-z^{-1})=z^{-1}(cX(z)+CY(z)+T(z))$ $T(z)(1-z^{-1})=z^{-1}(bX(z)+BY(z)+S(z))$ $S(z)(1-z^{-1})=z^{-1}(aX(z)+AY(z))$

The z transform equations can be solved to derive Y(z) as a single function of X(z) (Equation 3)

$$Y(z) = fX(z) + \frac{z^{-1}}{(1-z^{-1})}\left(eX(z) + EY(z) + \frac{z^{-1}}{1-z^{-1}}\left(dX(z) + DY(z) + \frac{z^{-1}}{1-z^{-1}}\left(cX(z) + CY(z) + \frac{z^{-1}}{1-z^{-1}}\left(bX(z) + BY(z) + \frac{z^{-1}}{1-z^{-1}}(aX(z) + AY(z))\right)\right)\right)\right)$$

This may be reexpressed as shown in the right hand side of the following equation, Equation 4. A desired transfer function of the DSM can be expressed in series form $$\frac{Y(z)}{X(z)}$$

given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}}$$

-continued $$= \frac{f(1-z^{-1})^5 + z^{-1}e(1-z^{-1})^4 + z^{-2}d(1-z^{-1})^3 + z^{-3}c(1-z^{-1})^2 + z^{-4}b(1-z^{-1}) + z^{-5}a}{(1-z^{-1})^5 - z^{-1}E(1-z^{-1})^4 - z^{-2}D(1-x^{-1})^3 - z^{-3}C(1-z^{-1})^2 - z^{-4}B(1-z^{-1}) - Z^{-5}A}$$

Equation 4 can be solved to derive the coefficients f to a from the coefficients $\alpha_0$ to $\alpha_5$ and coefficients E to A from the coefficients $\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha_0$.

ANNEX 4

The term $\alpha_0(1-z^{-1})^5$ is then subtracted from the left hand numerator resulting in $\alpha_0+\alpha_1 z^{-1} \ldots + \ldots \alpha_5 z^{-5} - \alpha_0(1-z^{-1})^5$ which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denominator.

We claim:

1. A signal processor for processing 1-bit signals comprising:
   an input for receiving a 1-bit signal having a first sampling rate;
   means coupled to the input for increasing the first sampling rate to a second sampling rate greater than the first rate;
   a plurality of 1-bit nth order Delta-Sigma Modulators (where $n \geq 1$) arranged in a series of stages for processing the signals at the second sampling rate; and
   means coupled to the stages to receive the processed 1-bit signal and to reduce the second sampling rate to the first sampling rate for output.

2. A signal processor according to claim 1, wherein the said series of stages are implemented on a single integrated circuit.

3. A signal processor according to claim 1, wherein the means coupled to the input for increasing is formed as a part of said integrated circuit.

4. A signal processor according to claim 1, wherein the means coupled to the stages for reducing is formed as part of said integrated circuit.

5. A signal processor according to claim 1, wherein the means coupled to the stages for reducing comprises an FIR filter.

6. A signal processor according to claim 1, wherein the means coupled to the stages for reducing comprises a Delta-Sigma Modulator having at least two inputs and bit delay means for presenting bits of the 1-bit signal simultaneously to the respective two inputs.

7. A signal processor according to claim 6, wherein the Delta-Sigma Modulator of the means coupled to the stages for reducing comprises:
   a first input for receiving odd samples of the 1-bit signal;
   a second input for receiving even samples of the 1-bit signal;
   a linear signal processing section for combining the odd and even samples of the 1-bit signal to produce a p-bit signal;
   a filter for filtering the p-bit signal;
   a noise shaping section which feeds a processed 1-bit signal back to an adder at the output of the filter for summation with said p-bit signal; and
   a quantizer which converts the summed signal to the processed 1-bit signal, the processed 1-bit signal being the output signal of the Delta-Sigma Modulator.

8. A signal processor according to claim 6, wherein the Delta Signa Modulator of the means coupled to the stages for reducing comprises an nth order Delta Sigma Modulator (DSM) having:
   a first input for receiving odd signal samples;
   a second input for receiving even signal samples;
   a quantizer for requantizing a p-bit signal to 1-bit form the requantized signal being the output signal of the processor;
   a plurality of signal combiners including a first combiner for forming an integral of an additive combination of the product of the odd samples and a first coefficient and of the product of the even samples and a second coefficient and of the product of the output signal and a third coefficient, at least two intermediate combiners for forming an integral of an additive combination of the product of the odd samples and the first coefficient and of the product of the even samples and the second coefficient and of the product of the output signal and the third coefficient and of the integral of the preceding stage; and
   a final combiner for forming an additive combination of the product of the odd samples and the first coefficient and of the product of the even samples and the second coefficient and of the integral of the preceding stage to form the said p-bit signal which is requantized by the quantizer.

9. A signal processor according to claim 1, wherein said signal processor is an audio signal processor.

10. A signal processor according to claim 8, wherein n=3.

* * * * *